United States Patent [19]

Kuboki et al.

[11] Patent Number: 4,523,180
[45] Date of Patent: Jun. 11, 1985

[54] ANALOG TO DIGITAL CONVERTER

[75] Inventors: Shigeo Kuboki, Nakaminato; Kazuo Kato, Ibaraki, both of Japan

[73] Assignee: Hitachi, Ltd., Tokyo, Japan

[21] Appl. No.: 277,609

[22] Filed: Jun. 26, 1981

[30] Foreign Application Priority Data

Jun. 27, 1980 [JP] Japan ................................. 55-86639

[51] Int. Cl.³ ............................................. H03K 13/02
[52] U.S. Cl. ........................ 340/347 AD; 340/347 SH
[58] Field of Search ................. 340/347 AD, 347 SH, 340/347 DA

[56] References Cited

PUBLICATIONS

Fotouhi "1979 IEEE International Solid-State Circuits Conference", Feb. 15, 1979, pp. 186-187.

Primary Examiner—Charles D. Miller
Attorney, Agent, or Firm—Antonelli, Terry & Wands

[57] ABSTRACT

In an analog to digital converter of the type wherein an analog input voltage is compared, at a comparator with a known reference voltage selected based on a digital data produced from a control circuit, an updated digital data is generated based on a result of the comparison, and the above operation is repeated to perform digital conversion sequentially from higher bit to lower bit, there are provided two capacitors of capacitances at a predetermined ratio which is so determined as to reduce the number of serial resistors in a voltage generator circuit adapted to generate the reference voltage based on the digital data produced from the control circuit, and a voltage developing at a junction between the two capacitors is coupled to the input of the comparator, so that a change in voltage of the voltage generator circuit is reduced at a predetermined ratio in accordance with electric charge distributed on the two capacitors and is applied to the input of the comparator.

10 Claims, 10 Drawing Figures

ANALOG TO DIGITAL CONVERTER

This invention relates to an analog to digital converter.

In an analog to digital converter of the type wherein an analog reference voltage is generated in accordance with a digital data, the analog reference voltage is compared with an input voltage subject to digital conversion, and a control circuit responsive to a result of the comparison changes the digital data so as to sequentially decide logics of the digital data from higher bits to lower bits, highly precise conversion has recently been demanded and minimization of the chip size of an LSI converter has also been required.

In order to increase the number of digital bits subject to digital conversion, that is, precision of the digital conversion, it is necessary to increase resolution of the reference voltage generated in accordance with the digital data. A voltage generator circuit adapted to generate the reference voltage has a series circuit in which a number of resistors of the same resistance are connected in series, and a constant voltage applied across the series circuit is divided by the serial resistors to generate a number of divisional voltages serving as reference voltages. In order to increase resolution of the reference voltage with the voltage generator circuit of the above construction, increase in the number of the division resistors is necessary. Specifically, the number of the division resistors must be doubled to increase the resolution by one bit. For example, 256 division resistors are used to obtain resolution of 8 bits and when it is desired to increase the resolution by one bit so as to obtain resolution of 9 bits, the number is doubled, amounting to 512 of division resistors. Therefore, in the LSI analog to digital converter, the voltage generator circuit inevitably occupies a considerably increased chip area. Especially, to increase the resolution by one bit, the chip area occupied by the voltage generator circuit is required to be doubled with the result that the overall chip area of the analog to digital converter is increased, thus raising production cost. Moreover, the package case affects various irregular factors of mechanical stress on the division resistors distributed in the increased area of the voltage generator circuit, making it difficult to obtain a uniform resistance of the division resistors. For these reasons, precision for the digital conversion is difficult to improve.

An object of this invention is to provide an analog to digital converter of a minimized chip area capable of highly precise digital conversion.

An analog to digital converter according to the invention comprises a voltage generator circuit as conventionally used, and at least two capacitors on which electric charge is distributed such that the resolution of the reference voltage can be increased without increasing the number of division resistors. One of a majority of outputs from the voltage generator circuit is selected by a first switching circuit in accordance with a digital data and applied therethrough to a first capacitor. One of a majority of outputs from the voltage generator circuit is also selected by a second switching circuit in accordance with the digital data and applied therethrough to a second capacitor. Capacitance of the first capacitor is related to that of the second capacitor in a predetermined relationship, and one end of the first capacitor is connected to one end of the second capacitor. After terminal voltage of the first capacitor is set to a predetermined value by means of the first switching circuit, voltage applied to the second capacitor connected to the first capacitor is changed for fine adjustment of the terminal voltage of the first capacitor, so that effect comparable to the generation of various highly resolved reference voltages can be attained. By using the voltages as the reference voltage of the analog to digital converter, highly percise digital conversion can be accomplished without increasing the number of the division resistors.

Figure 1:
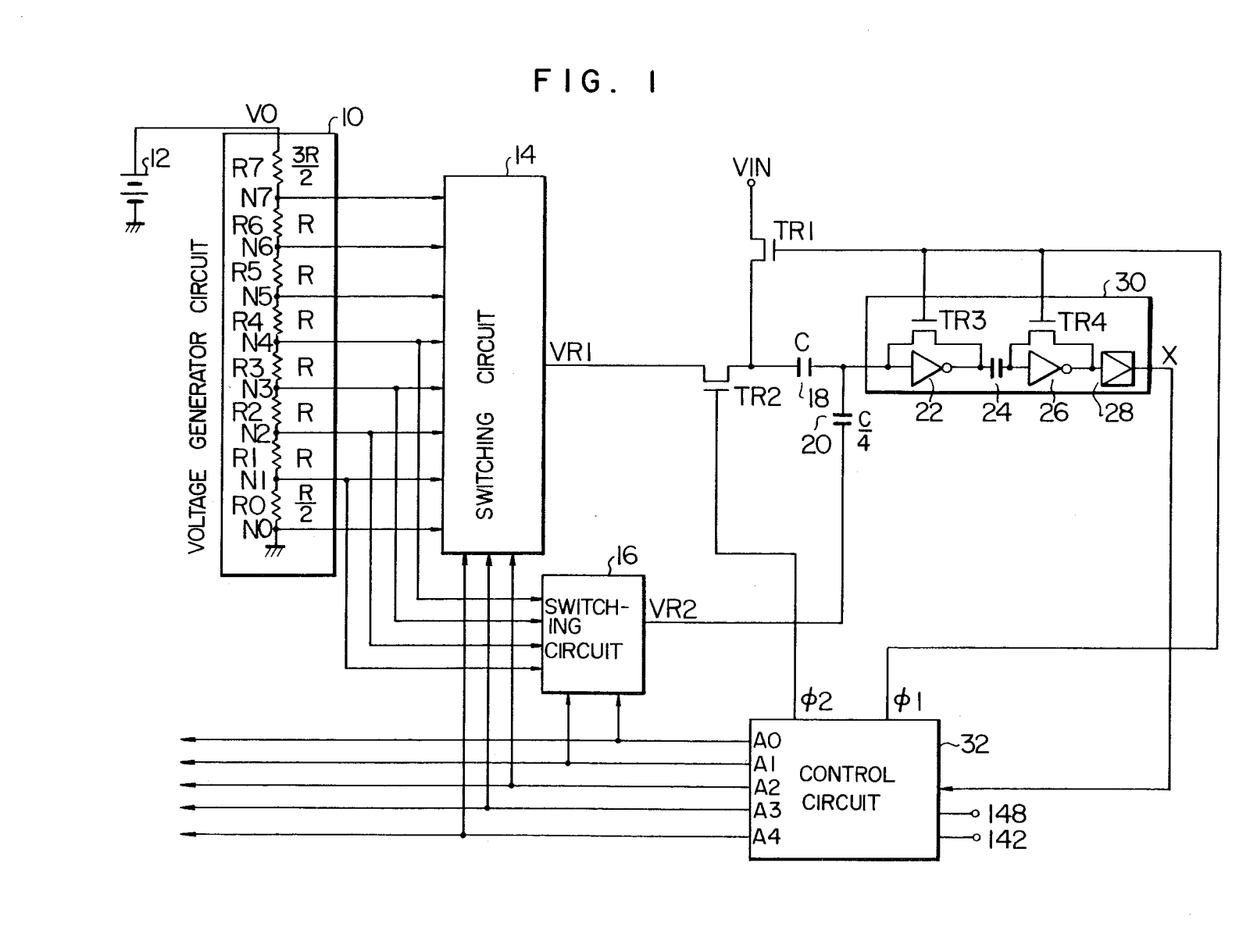
FIG. 1 is a block diagram of an analog to digital converter embodying the invention.

Referring now to FIG. 1, there is shown, in block form, an analog to digital converter embodying the invention. For better understanding of the present invention, FIG. 1 illustrates a specified, especially, 5-bit analog to digital converter in which 3-bit precision obtained by a conventional system is added with 2-bit precision by the improvement according to the present invention. However, the conventional system is by no means limited to the 3-bit system. The present-day technology ensures the production of an 8 to 10-bit system at low cost and the precision can be improved by additional 2 to 4 bits based on teachings of the present invention.

Outline

A voltage generator circuit 10 having a series circuit of resistors R0 to R7 is applied with a constant voltage V0 from a D.C. power source 12. While each of the resistors R1 to R6 has a fixed resistance R($\Omega$), the resistor R0 has a resistance of R/2 ($\Omega$) and the resistor R7 has resistance of 3R/2 ($\Omega$). Due to these resistances, at junctions N0 to N7 of the resistors, divisional voltages develop which are applied to a switching circuit 14. In response to higher bits A4 to A2 of digital data A4 to A0 delivered out of a control circuit 32, the switching circuit 14 selects one of the outputs of the voltage generator circuit 10. The thus selected output, identified as an output voltage VR1, is fed to a MOS transistor TR2 which is operable as a switch. On the other hand, the outputs of the voltage generator circuit 10 are applied in part to a switching circuit 16 which responds to lower bits A1 and A0 from the control circuit 32 to select one of the outputs of the voltage generator circuit. The thus selected output, identified as an output voltage VR2, charges a capacitor 20.

An analog input voltage $V_{IN}$ (V) to be subjected to digital conversion charges a capacitor 18 through a transistor TR1 which is operable as a switch. The analog input voltage VIN and the output voltage VR1 of the switching circuit 14 are compared at a comparator circuit 30 comprised of inverters 22 and 26, an amplifier 28, a capacitor 24, and MOS transistors TR3 and TR4, and a comparison result X is applied to the control circuit 32. Based on the comparison result X, the control circuit 32 updates the digital data A4 to A0. This operation is repeated to sequentially determine each bit of the digital data A4 to A0 until the A0 bit is decided to complete the digital conversion.

Figure 2:
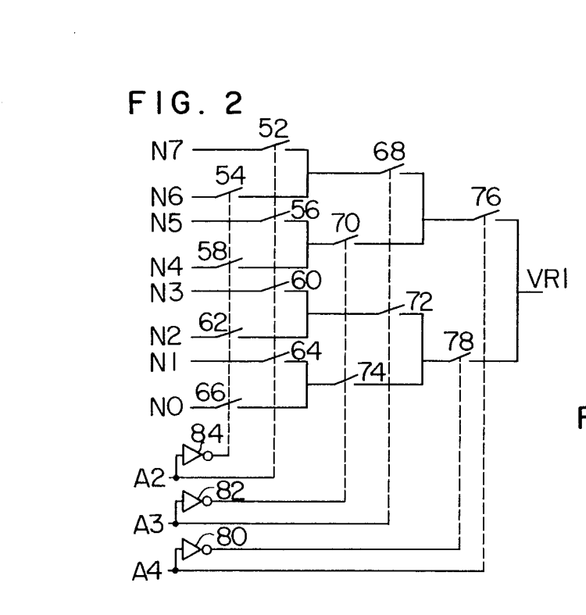
FIG. 2 is a circuit diagram showing details of a switching circuit 14 shown in FIG. 1.

The switching circuit 14 of FIG. 1 is a well known circuit as detailed in FIG. 2. Switches 52 to 78 arranged in a tree configuration and constituted by MOS transistors are selectively turned on by signals created from the digital data A4 to A2 and inverters 80 to 84, so that one of the divisional voltages at junctions N7 to N0 is selected and taken out as the voltage VR1.

Figure 3:
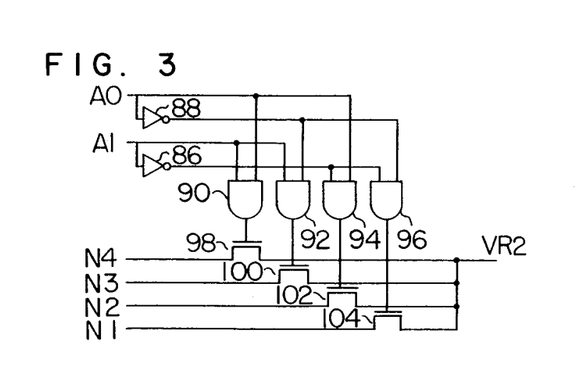
FIG. 3 is a circuit diagram showing details of a switching circuit 16 shown in FIG. 1.

Details of the switching circuit 16 of FIG. 1 are shown in FIG. 3. Inverters 86 and 88 and AND gates 90 to 96 constitute a decoder, and one of MOS transistors 98 to 104 is selectively turned on by lower bits A1 and A0 of the digital data.

Figure 4:
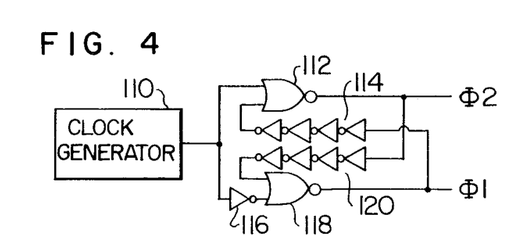
FIG. 4 is a circuit diagram showing a synchronizing signal generator circuit constituting a control circuit shown in FIG. 1.
Figure 5:
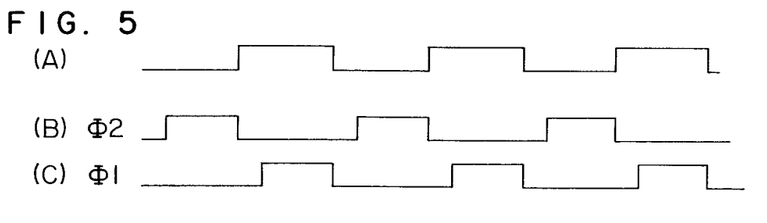
FIG. 5 shows waveforms useful in explaining the operation of the FIG. 4 circuit.

Details of the control circuit 32 shown in FIG. 1 are illustrated in FIGS. 4 to 7. Shown in FIG. 4 is a circuit for generating synchronizing signals Φ1 and Φ2, in which NOR gates 112 and 118, an inverter 116, and delay circuits 114 and 120 operate in response to the output of a clock generator 110. Illustrated in FIG. 5 are waveforms useful to explain the operation of the generator circuit as shown in FIG. 4 and adapted to generate synchronizing signals Φ1 and Φ2; especially, the output of the clock generator 110 is illustrated in section (A), a waveform of the synchronizing signal Φ2 in section (B) and a waveform of the synchronizing signal Φ1 in section (C). In order to prevent logics "1" of the synchronizing signals Φ1 and Φ2 from being overlapped, the delay circuits 114 and 120 are provided. Thus, a logic "0" of the synchronizing signal Φ2 is delayed at the delay circuit 120 and applied to the NOR gate 118, from which a delayed logic "1" of the synchronizing signal Φ1 is produced. On the other hand, a logic "0" of the synchronizing signal Φ1 is delayed at the delay circuit 114 and applied to the NOR gate 112, from which a delayed logic "1" of the synchronizing signal Φ2 is produced. As a result of the above operation, the logics "1" of the synchronizing signals Φ1 and Φ2 will not overlap.

Figure 6:
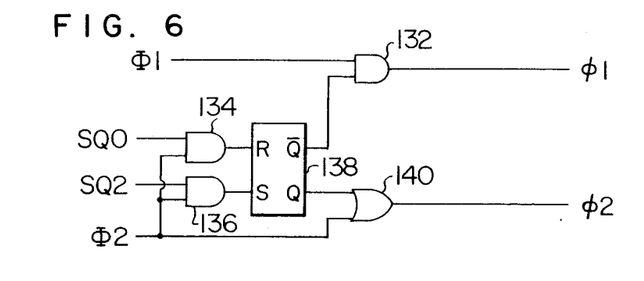
FIG. 6 is a circuit showing a $\emptyset_1$, $\emptyset_2$ signal generator circuit constituting the control circuit shown in FIG. 1.
Figure 7:
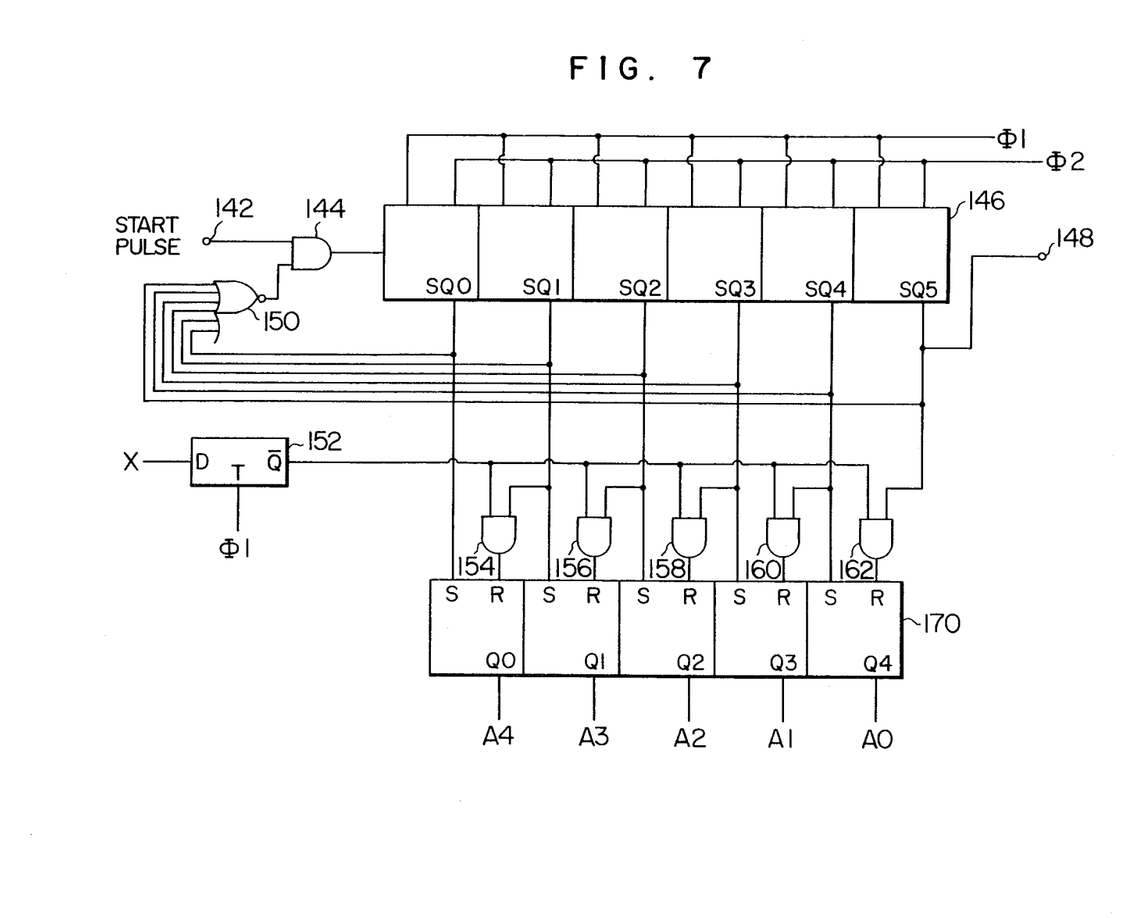
FIG. 7 is a circuit diagram showing a major component of the control circuit shown in FIG. 1.

Signals ∅1 and ∅2 for controlling the MOS transistors TR1 to TR4 in FIG. 1 are generated by a generator circuit as shown in FIG. 6. A signal SQ0 as generated at a circuit shown in FIG. 7 to be described below is received by the generator circuit of FIG. 6 and applied through an AND gate 134 to a flip-flop 138 in synchronism with the signal Φ2 so as to reset the same, thus enabling an AND gate 132. In this manner, the signal ∅1 is generated based on the signal Φ1. On the other hand, the signal ∅2 standing for an output of an OR gate 140 is generated based on the signal Φ2. Subsequently, when a signal SQ2 to be described later with reference to FIG. 7 is generated, the flip-flop 138 is set in synchronism with the signal Φ2. As a result, the AND gate 132 is disabled, changing the output ∅1 from "1" to "0". But the output ∅2 of the OR gate 140 remains "1" irrespective of the signal Φ2.

FIG. 7 shows a major component of the control circuit 32. In the figure, when all of outputs of a 5-bit shift register 146 operating under the synchronizing signals Φ1 and Φ2 are "0", the output of a NOR gate 150 is ready to enable an AND gate 144. Under this condition, with application of a start signal to a terminal 142, the shift register 146 receives a logic "1" which, in turn, is shifted sequentially by the synchronizing signals Φ1 and Φ2 through respective stages constituting the shift register. Outputs SQ0 to SQ5 attributable to this shift signal are applied to a register 170. The output X of the comparator circuit 30, on the other hand, is applied to reset terminals of the register 170 through a D-type flip-flop 152 and AND gates 154 to 162. In accordance with the outputs SQ0 to SQ5 of the shift register 146 and the outputs of the AND gates 154 to 162, the contents of the register 170 are determined and the digital data A4 to A0 are decided. When the output SQ5 of the shift register 146 assumes "1", the digital conversion is completed and a signal indicative of the completion of the digital conversion develops at a terminal 148.

Figure 8:
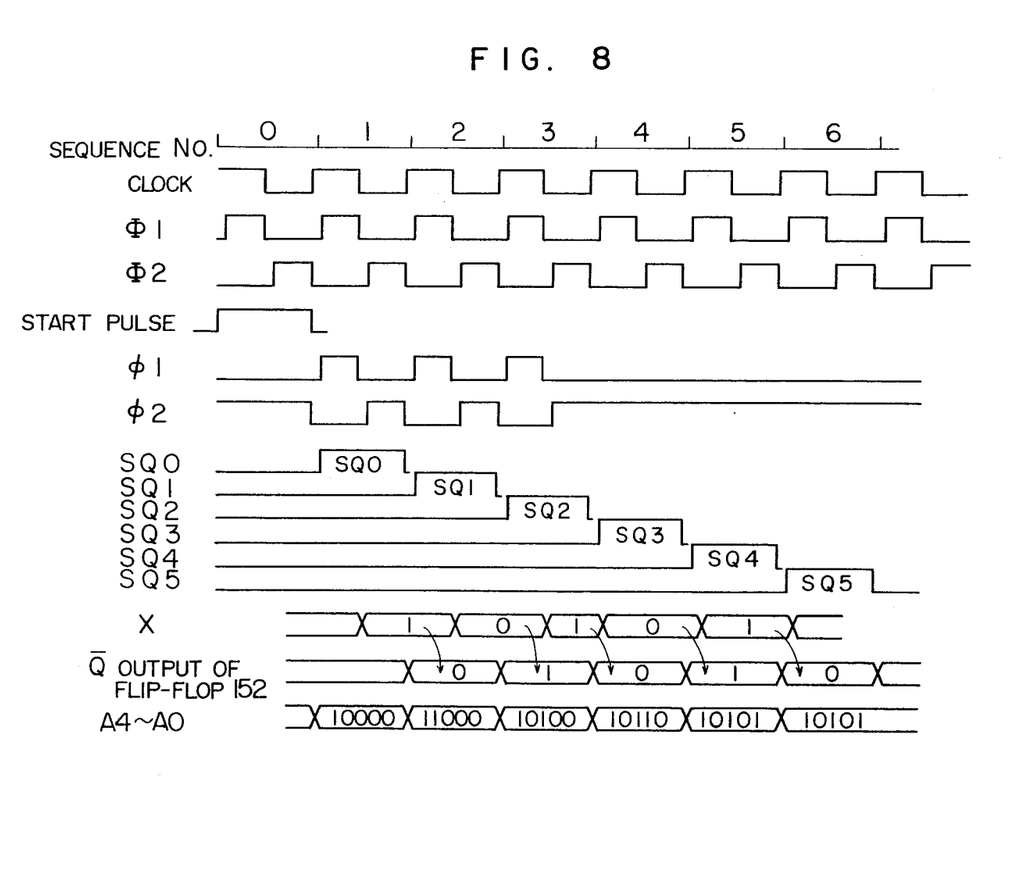
FIG. 8 shows waveforms useful in explaining the operation of the control circuit shown in FIG. 1.
Figure 9:
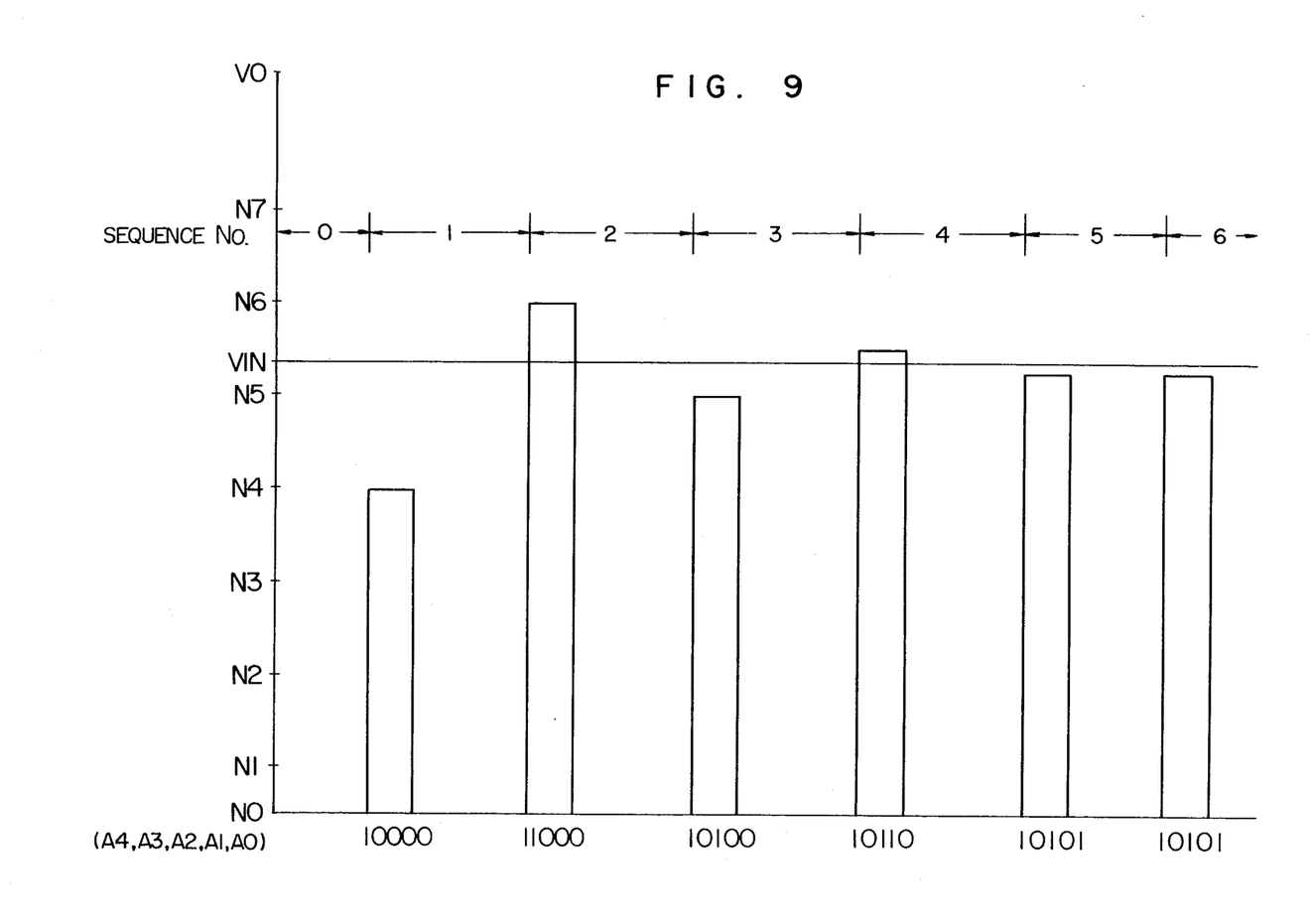
FIG. 9 is a graph useful in explaining the operation of the analog to digital converter shown in FIG. 1.

The operation of the control circuit 32 is diagrammatically shown in FIG. 8 and the operation of the digital conversion in FIG. 9. As shown in FIG. 9, the operation of the digital conversion as embodied herein is divided into seven major sequences No. 0 to No. 6. Prior to describing these sequences starting from sequence No. 0 with reference to FIGS. 1 to 9, the FIG. 1 comparison operation between the output VR1 of the switching circuit and the analog input $V_{IN}$ will first be described since this operation is common to all the sequences.

Comparison Operation

Figure 10:
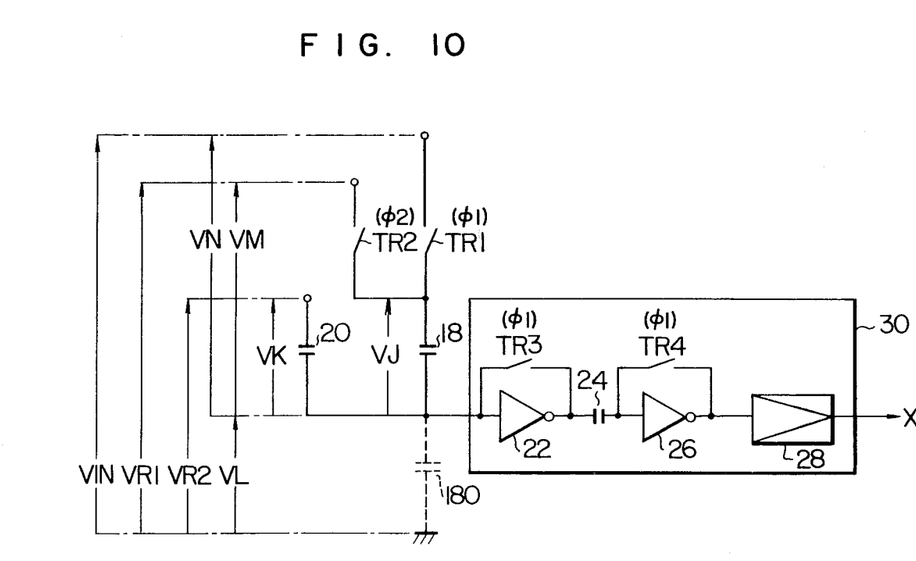
FIG. 10 is a diagrammatic representation useful in explaining the comparison operation in the FIG. 1 converter.

FIG. 10 shows a partial enlargement diagram of FIG. 1 which depicted with the voltage relationship for convenience of explanation of the comparison operation. In the figure, a capacitor 180 is a parasitic capacitor associated with the input terminal of the inverter 22.

1. Fixing of input/output voltage of inverters 22 and 26

When the transistors TR3 and TR4 are turned on by the signal ∅1 from the control circuit 32, the input and output terminals of each of the inverters 22 and 26 are short-circuited. Consequently, the input/output terminal of each of the inverters 22 and 26 is fixed to a threshold voltage inherent to the inverter 22 or 26. More particularly, assuming now that the inverters 22 and 26 have threshold voltages VS1 and VS2, respectively, a voltage VL across the capacitor 180 becomes VS1. A voltage across the capacitor 24, on the other hand, becomes a difference voltage between the threshold voltages VS1 and VS2. In this manner, in response to the signal ∅1, the input/output voltages of the inverters 22 and 26 are fixed to their threshold voltages. It should be understood that the threshold voltage of the inverter 22 stands for the threshold voltage of the comparator circuit 30.

2. Sampling of analog voltage VIN

The signal ∅1 also turns on the MOS transistor TR1 and the capacitor 180 is charged in accordance with the analog input voltage VIN. Since the terminal voltage VL of the capacitor 180 is fixed to the threshold voltage VS1 of the inverter 22, a voltage VJ across the capacitor 18 becomes a difference voltage VN=VIN−VS1 between the input voltage VIN and the threshold voltage VS1. In other words, when the signal ∅1 is applied to the MOS transistors TR1, TR3 and TR4, the input terminal of the inverter 22 assumes the threshold voltage and the capacitor 18 maintains the difference voltage between the input voltage VIN and the threshold voltage of comparator circuit 30. The output VR2 of the switching circuit 16, on the other hand, is held constant to provide a voltage VK across the capacitor 20 which is a difference between the voltage VR2 and the threshold voltage of comparator circuit 30.

3. Comparison operation between input voltage VIN and output VR1 of switching circuit 14

Next, as the logic of the signal ∅1 changes to "0", the transistors TR1, TR3 and TR4 are turned off. Thereafter, the signal ∅2 takes place and turns on the MOS transistor TR2 with the voltage VR1 applied to the capacitor 18. If the voltage VR1 is larger than the input voltage VIN, the terminal voltage VL of the capacitor 180 exceeds the threshold voltage VS1 of the comparator circuit, thereby producing a comparison output X of logic "1". Conversely, if the voltage VR1 is smaller than the input voltage VIN, the terminal voltage VL of the capacitor 180 falls below the threshold voltage VS1 of comparator circuit 30, thereby producing a comparison output X of logic "0".

4. Correction of reference voltage based on change in voltage VR2.

The foregoing comparsion operation has been described on the assumption that the voltage VR2 applied to the capacitor 20 is fixed, and only the voltage VR1 was compared with the input voltage VIN. In the following description, however, the voltage VR2 will be changed. Firstly, the MOS transistors TR1, TR3 and TR4 are turned on by the signal ∅1 to ensure that the capacitor 18 maintains the difference voltage between the threshold voltage VS1 of the comparator and the input voltage VIN. Then, the transistors TR1, TR3 and TR4 are turned off and the transistor TR2 is turned on by the signal ∅2. The procedures mentioned just above are the same as before. Since the voltage VR1 applied to the transistor TR2 is smaller than the input voltage VIN, the terminal voltage VL of the capacitor 180 falls below the threshold voltage VS1 of comparator 30. The output voltage VR2 of the second switching circuit 16 is now increased. This increases the input voltage to the comparator 30, that is, the terminal voltage VL. Accordingly, the comparison operation now judges whether or not the increased voltage VL exceeds the threshold voltage VS1 of comparator 30. It is now assumed that the capacitance of capacitor 20 is half the capacitance of capacitor 18 and the capacitor 180 is negligible. Then, if follows that electric charge is shared by the capacitors 18 and 20 such that a change in the terminal voltage of capacitor 20 caused by a change in the voltage VR2 is half a change in the terminal voltage of capacitor 18, resulting in an increase in the input terminal voltage of the comparator 30. By raising the terminal voltage of capacitor 20 and changing the charge distribution on the capacitors 20 and 18 in this manner, the input volage VL to the comparator can be changed. Effect accuring from such a change is comparable to that brought about by changing the output voltage VR1 of switching circuit 14. In addition, the change in the voltage VR2 is advantageous over the change in the voltage VR1 in that it is possible to change the input voltage VL to the comparator 30 at a smaller width than the voltage change width of the FIG. 1 voltage generator circuit. Moreover, by selecting the relation between capacitances of the capacitors 20 and 18 so as to be, for example, 1:2, 1:4 or 1:8, the voltage change width of the comparator 30 can be controlled properly. 5. Fine adjustment of input voltage to comparator 30

As described above, the change in the output voltage VR2 of the FIG. 1 switching circuit 16 causes the input voltage to the comparator 30 to change at the rate which is determined by a ratio between capacitances of the capacitors 20 and 18. A minimum change value of the output voltage VR2 of switching circuit 16 corresponds to a minimum voltage of the voltage generator circuit 10. This relation makes it possible to generate, at the input terminal of the comparator 30, a voltage which can vary at a smaller change value than the minimum voltage of the voltage generator circuit 10, giving rise to effect equivalent to that obtained by increasing the number of divisional voltages in the voltage generator circuit.

The operation following the sequence number will be described in detail with reference to FIGS. 8 and 9.

Sequence No. 0

A start pulse or a request for digital conversion as shown in FIG. 8 is applied to the control circuit 32 via the terminal 142 shown in FIG. 7. This start pulse is then fed to the shift register 146 via the AND gate 144. This AND gate 144 is enabled by the output of the NOR gate 150 only when all of the outputs of the shift register 146 are "0". When at least one of the outputs of the shift register 146 is "1" indicating that the digital conversion is in progress, the AND gate 144 is disabled to prevent transmission of the start pulse to the shift register. Even if the start pulse is a prolonged pulse, no errors in operation occur because the AND gate is disabled at the beginning of receipt of the start pulse by the shift register and hence the output of the AND gate disappears following a predetermined duration.

Sequence No. 1

The output SQ0 of the shift register 146 assumes "1" and the register 170 holds "10000". Consequently, the digital data A4 to A2 applied to the switching circuit 14 assumes "100". As a result, a divisional voltage at junction N4 in the voltage generator circuit 10 is selected by the switches 76, 70 and 58 and delivered out as the output voltage VR1. On the other hand, the digital data A1 and A0 applied to the switching circuit 16 assumes "00" so that a divisional voltage at junction N1 is selected by the AND gate 96 and the MOS transistor 104 and delivered out as the output voltage VR2.

In the manner as described hereinbefore, the input voltage VIN is applied to the capacitor 18 in response to the signal ∅1 and the capacitor 18 holds the difference voltage relative to the threshold voltage of comparator 30.

Subsequently, in response to the signal ∅2, the voltage VR1 is applied to the capacitor 18 via the transistor TR2 and the input voltage VIN is compared with the divisional voltage at junction N4. Assuming that the magnitude of the input voltage VIN lies between divisional voltages at junctions N5 and N6 as shown in FIG. 9, the input voltage VIN exceeding the divisional voltage at junction N4 causes the comparator 30 to produce an output X of "1".

Sequence No. 2

In response to rising of the synchronizing signal Φ1, the output X of the comparator 30 is set into the D-type flip-flop 152 and a logic "0" from a reset output terminal ovs/Q/ of the flip-flop 152 is applied to the AND gate 154. Thus, with the AND gate 154 being disabled, the signal A4 set in the register 170 is held therein. In this way, the fifth bit of a digital output has been determined.

As in sequence No. 1, when the transistors TR1, TR3 and TR4 are turned on by the signal ∅1, the capacitor 18 again holds the difference voltage between the input voltage VIN and the threshold voltage. In the control circuit, on the other hand, the output SQ1 of the shift register 146 is set into the register 170 and the output of the register 170 assumes "11000". The switches 76, 68 and 54 in the switching circuit shown in FIG. 2 are then turned on and a divisional voltage at junction N6 in the voltage generator circuit is applied, as the voltage VR1, to the transistor TR2. As a result, the input voltage VIN is compared with the divisional voltage at junction N6. As shown in FIG. 9, the divisional voltage at junction N6 exceeds the input voltage VIN and the comparison output X becomes "0".

Sequence No. 3

In response to rising of the synchronizing signal Φ1, the output X of the comparator is set into the D-type flip-flop 152 and the output ovs/Q/ becomes "1". As a result, the AND gate 156 resets the output A3 of the register 170. The transistors TR1, TR3 and TR4 are turned on by the signal ∅1, and the input voltage VIN is sampled by the capacitor 18. On the other hand, the output SQ2 of the shift register becomes "1" and brings the output A2 of register 170 into a logic "1". As a result, the output of the register 170 assumes "10100". The switches 76, 70 and 56 as shown in FIG. 2 are then turned on and a divisional voltage at junction N5 is applied, as the output voltage VR1, to the transistor TR2. Thus, when the transistor TR2 is turned on by the signal ∅2, the input voltage VIN is compared with the divisional voltage at junction N5. As shown in FIG. 9, the input voltage VIN exceeds the divisional voltage at junction N5 and the comparison output X becomes "1". This condition indicates that the input voltage VL to the comparator 30 is below the threshold voltage of the comparator 30.

As shown in FIG. 6, the output SQ2 of shift register 146 sets the flip-flop 138 so that the signal ∅1 is deactivated and the signal ∅2 is maintained at "1". Therefore, the transistor TR2 is kept turned on whereas the transistors TR1, TR3 and TR4 are kept turned off.

Sequence No. 4

In response to rising of the synchronizing signal Φ1, the comparison output X is set into the D-type flip-flop 152 and the output ovs/Q/ thereof becomes "0". As a result, the output A2 of the register 170 remains "1". Consequently, the digital data A4 to A2 applied to the switching circuit 14 is fixed to "101" and the voltage VR1 is fixed to the divisional voltage at junction N5. In addition, the outputs A1 and A0 of register 170 become "10". Thus, the output VR2 of the switching circuit 16 changes from the divisional voltage at junction N1 to the divisional voltage at junction N3. As a result, the input voltage VL to the comparator 30 rises by half the voltage difference between two adjacent junctions of the junctions N1 to N2. This simulates the effect wherein the input voltage VIN is compared with an intermediate voltage between the junctions N5 and N6. Under this condition, the intermediate voltage between the junctions N5 and N6 exceeds the input voltage VIN and hence the input voltage VL to the comparator 30 exceeds the threshold voltage VS1, thus causing the comparator to produce the comparison result of "0".

Sequence No. 5

In response to rising of the synchronizing signal Φ1, comparison result X is set into the D-type flip-flop and the output ovs/Q/ of the D-type flip-flop becomes "1". Consequently, the output A1 of the register 170 is reset and assumes "0". Also the since the output SQ4 of the shift register 146 is set into the register 170, the outputs A1 and A0 of the register assume "01". The MOS transistor 102 as shown in FIG. 3 is then turned on and the output VR2 of the switching ciruit 16 is reduced to a divisional voltage at junction N2. Consequently, the input voltage VL to the comparator 30 is reduced by ¼ of the voltage for sequence No. 4 (the intermediate voltage between junctions N3 and N2). Consequently, the magnitude of this input voltage VL is equal to that of a comparator input voltage obtained when a voltage which is higher than the divisional voltage at junction N5 by ¼ X (intermediate voltage between junctions N5 and N6) is applied as the voltage VR1. Thus, the input voltage VIN is compared with the voltage which is higher than the divisional voltage at junction N5 by ¼ of an intermediate voltage between junctions N5 and N6. Under this condition, the comparator 30 produces the output X of "1".

Sequence No. 6

In response to rising of the synchronizing signal Φ1, the output X of the comparator 30 is set into the D-type flip-flop 152 and the output ovs/Q/ assumes "0". Then, even with occurrence of the output SQ5 of the shift register 146, the AND gate 162 remains disabled and the output A0 of the register 170 is not reset and it remains unchanged. A signal indicative of completion of the digital conversion is delivered out of the output terminal 148. At this time, the data held in the register 170 corresponds to an analog to digital conversion value which is "10101" in this embodiment.

As described above, according to the foregoing embodiment, even with the voltage generator circuit comprised of the series circuit having a number of resistors in compliance with the conventional 3-bit precision, it is possible to accomplish digital conversion of 5 bits. Specifically, the conventional system required 32 resistors to perform the 5-bit precision digital conversion. In contrast, the foregoing embodiment suffices 8 resistors for the same performance. Thus, the invention can minimize the number of resistors used in the voltage generator circuit.

What is claimed is:
1. In an analog to digital converter comprising:
a voltage generator circuit having a series circuit of a plurality of resistors connected in series to which is applied a constant voltage, for generating a plurality of divisional voltages due to division of the constant voltage by each of the serial resistors;
a first switching circuit which receives the divisional voltages produced from the voltage generator circuit and which is responsive to a higher bit group of digital data consisting of the higher bit group and a lower bit group, for selecting and delivering out one of the divisional voltages;
an input means which receives an analog input voltage subject to digital conversion;

a first capacitor having one end coupled to the input means and the first switching circuit through first and second switching means, respectively;

a comparator circuit coupled to the other end of the first capacitor; and a control circuit which generates an updated digital data based on an output of the comparator circuit, whereby the first and second switching means are respectively operated to allow the comparator circuit to compare the input voltage received by the input means with the one divisional voltage selected by the first switching circuit, the improvement wherein said converter comprises:

a second switching circuit responsive to the lower bit group of the digital data, for selecting one of the divisional voltages of the voltage generator circuit; and a second capacitor having one end coupled to the other end of the first capacitor and said second capacitor having another end coupled to said second switching circuit to be charged with an output of the second switching circuit.

2. An analog to digital converter according to claim 1 wherein the second capacitor has a capacitance which is determined at a predetermined ratio to a capacitance of the first capacitor in accordance with the number of bits of the digital data lower bit group.

3. An analog to digital converter according to claim 2 wherein the second capacitor has a capacitance of $C/2^N$, where N represents the number of bits of the digital data lower bit group, and C represents a capacitance of the first capacitor.

4. An analog to digital converter according to claim 1 wherein the number of the serial resistors is based on the number of bits of the digital data higher bit group, and wherein said second switching circuit receives a number of the divisional voltages generated by the serial resistors, which number is determined based on the number of bits of the digital data lower bit group.

5. An analog to digital converter according to claim 1 wherein said comparator circuit comprises at least an initial stage which includes an inverter and a third transistor operable to short-circuit the inverter, said third transistor being turned on when at least one of said first and second transistors is turned on.

6. An analog to digital converter comprising:

a first voltage providing means for providing a first analog voltage having a magnitude defined by the upper bits of digital data having upper and lower bits;

an input circuit which receives an analog voltage to be converted into a digital signal;

a comparator for producing a comparison result of the first analog voltage with the analog input voltage.

a first capacitor circuit coupled between the output of the first voltage providing means and an input of the comparator;

a second voltage providing means for providing a second analog voltage having a magnitude defined by the lower bits of said digital data;

a second capacitor coupled between the output of the second voltage providing means and the input of the comparator; and a control circuit which receives the comparison result from the comparator and delivers the first and second digital data.

7. An analog to digital converter according to claim 6, wherein the second capacitor has a capacitance which is determined at a predetermined ratio to a capacitance of the first capacitor in accordance with the number of lower bits of said digital data.

8. An analog to digital converter according to claim 7, wherein the second capacitor has a capacitance of lower $C/2^N$, where N represents the number of bits of said digital data and C represents a capacitance of the first capacitor.

9. An analog to digital converter according to claim 7, wherein the first voltage providing means includes a series circuit of a plurality of resistors connected in series to which is supplied a constant voltage for generating a plurality of divisional voltages due to division of the constant voltage by each of the serial resistors and a first switching circuit which receives the divisional voltages produced from the plurality of resistors and which is responsive to the upper bits of said digital data for selecting and delivering out one of the divisional voltages; the number of the serial resistors is based on the number of said upper bits of said digital data; the second voltage providing means is responsive to the lower bits of said digital data for selecting one of the divisional voltages produced by the plurality of resistors and the number of divisional voltages produced by the second voltage providing means is based on the number of lower bits of said digital data; and wherein said second switching circuit receives a number of the divisional voltages which number is based upon the number of said lower bits of said digital data.

10. An analog to digital converter according to claim 9, wherein said comparator comprises at least an initial stage which includes an inverter and a switching circuit operable to shortcircuit the inverter under the control of the control circuit.

* * * * *